United States Patent
Huang

(10) Patent No.: US 9,824,727 B2
(45) Date of Patent: Nov. 21, 2017

(54) MEMORY APPARATUS CAPABLE OF PREVENTING LEAKAGE CURRENT

(71) Applicant: eMemory Technology Inc., Hsin-Chu (TW)

(72) Inventor: Kuo-Chun Huang, Chiayi (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/260,306

(22) Filed: Sep. 8, 2016

(65) Prior Publication Data

US 2017/0076765 A1   Mar. 16, 2017

Related U.S. Application Data

(60) Provisional application No. 62/216,378, filed on Sep. 10, 2015.

(51) Int. Cl.

| G11C 7/12 | (2006.01) |
|---|---|
| G11C 5/10 | (2006.01) |
| H01L 27/112 | (2006.01) |
| G11C 17/16 | (2006.01) |
| G11C 17/18 | (2006.01) |
| G11C 11/24 | (2006.01) |
| G11C 5/06 | (2006.01) |
| G11C 7/06 | (2006.01) |
| G11C 7/10 | (2006.01) |
| H03K 17/16 | (2006.01) |
| H03K 19/0185 | (2006.01) |

(52) U.S. Cl.
CPC ............. *G11C 5/10* (2013.01); *G11C 5/06* (2013.01); *G11C 7/06* (2013.01); *G11C 7/10* (2013.01); *G11C 7/12* (2013.01); *G11C 11/24* (2013.01); *G11C 17/16* (2013.01); *G11C 17/18* (2013.01); *H01L 27/11206* (2013.01); *H03K 17/161* (2013.01); *H03K 19/018507* (2013.01)

(58) Field of Classification Search
CPC ....................................................... G11C 7/12
USPC ............................................................. 365/203
See application file for complete search history.

(56) References Cited

U.S. PATENT DOCUMENTS

| 6,462,984 B1 * | 10/2002 | Xu | G11C 8/08 365/148 |
|---|---|---|---|
| 6,751,124 B2 * | 6/2004 | Lee | G11C 16/10 365/185.11 |
| 7,511,982 B2 * | 3/2009 | Kurjanowicz | G11C 17/16 365/100 |
| 7,586,802 B2 | 9/2009 | Hsu | |

(Continued)

*Primary Examiner* — Son Mai
(74) *Attorney, Agent, or Firm* — Winston Hsu

(57) ABSTRACT

A memory apparatus includes a memory sector including N memory blocks and N local bit lines, a pre-charge circuit, and a program sector selector. Each of the N memory blocks includes a plurality of memory cells. Each of the N local bit lines is coupled to memory cells in a corresponding memory block. The pre-charge circuit is coupled to the N local bit lines. The program block selector is coupled to the N local bit lines and configured to apply a first voltage to a selected local bit line coupled to a selected memory block during a program mode of the selected memory block. Unselected local bit lines coupled to unselected memory blocks are pre-charged to a second voltage by the pre-charge circuit during the program mode of the selected memory block, thereby avoiding current leakages of the memory apparatus.

27 Claims, 6 Drawing Sheets

(56) References Cited

U.S. PATENT DOCUMENTS

| | | | |
|---|---|---|---|
| 8,179,722 B2 | 5/2012 | Huh | |
| 8,634,251 B2 * | 1/2014 | Chung | G11C 7/12 |
| | | | 365/185.17 |
| 8,687,408 B2 * | 4/2014 | Kwon | G11C 5/02 |
| | | | 365/148 |
| 2007/0165441 A1 * | 7/2007 | Kurjanowicz | G11C 17/16 |
| | | | 365/96 |
| 2010/0027340 A1 * | 2/2010 | Di Iorio | G11C 7/02 |
| | | | 365/185.17 |
| 2012/0008417 A1 | 1/2012 | Choi | |
| 2014/0204681 A1 | 7/2014 | Jo | |

* cited by examiner

MEMORY APPARATUS CAPABLE OF PREVENTING LEAKAGE CURRENT

CROSS REFERENCE TO RELATED APPLICATIONS

This non-provisional application claims priority of U.S. provisional application No. 62/216,378, filed on Sep. 10, 2015, included herein by reference in its entirety.

BACKGROUND OF THE INVENTION

1. Field of the Invention

This invention relates to a memory apparatus, and more particularly, a memory apparatus capable of pre-charging unselected bit lines during a program operation of a selected memory block.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies. According to the programming times limit, non-volatile memory devices are divided into multi-time programmable (MTP) memory and one-time programmable (OTP) memory.

FIG. 1 shows a conventional one-time programmable memory cell 100. The memory cell 100 includes a select transistor 110 and an antifuse transistor 120. The select transistor 110 is used to select the memory cell to be programmed. The select transistor 110 has a first terminal, a second terminal coupled to a bit line BL, and a control terminal coupled to a word line WL. The antifuse transistor 120 has a first terminal, a second terminal coupled to the first terminal of the select transistor 110, and a control terminal coupled to an antifuse control line AF.

During the program operation of the memory cell 100, the bit line BL is at a low voltage, the word line WL is at a rather high voltage, and the antifuse control line AF is at an even higher voltage. In this case, the select transistor 110 would be turned on so the second terminal of the antifuse transistor 120 would receive the low voltage. Therefore, the antifuse transistor 120 can be ruptured by the high voltage applied to the antifuse transistor 120, such that data of logic "1" is written into the memory cell 100.

However, for the convenience of control, when using a plurality of memory cells 100 to build up a memory system, bit lines coupled to different memory cells may be coupled to a same signal path, and the signal path may provide the required voltages to the selected memory cell for the corresponding operation. In this case, unselected memory cells coupled to the same signal path may be floating, which can cause unexpected leakage current and lower the power efficiency of the memory system significantly. Therefore, how to implement a memory system with low leakage currents has become a critical issue to be solved.

SUMMARY OF THE INVENTION

One embodiment of the present invention discloses a memory apparatus including at least one memory sector, at least one first pre-charge circuit, and at least one program block selector. Each of the memory sector includes N memory blocks, N local bit lines. A number of the at least one first pre-charge circuit, a number of the at least one program block selector circuit, and a number of the at least one memory sector are the same.

Each of the N memory blocks includes a plurality of memory cells, wherein N is an integer greater than 1. Each of the N local bit lines is coupled to memory cells in a corresponding memory block. Each of the at least one first pre-charge circuit is coupled to the N local bit lines of a corresponding memory sector. Each of the at least one program block selector is coupled to the N local bit lines of a corresponding memory sector and is for applying a first voltage to a selected local bit line coupled to a selected memory block of a selected memory sector during a program mode of the selected memory block.

Unselected local bit lines coupled to unselected memory blocks are pre-charged to a second voltage by the at least one first pre-charge circuit during the program mode of the selected memory block. The first voltage is different from the second voltage.

Another embodiment of the present invention disclose a method for operating a memory apparatus. The memory apparatus includes at least one memory sector, at least one first pre-charge circuit, and at least one program block selector. Each of the at least one memory sector includes N memory blocks and N local bit lines, each of the N memory blocks includes a plurality of memory cells, and each of the N local bit lines is coupled to memory cells in a corresponding memory block. Each of the at least one first pre-charge circuit is coupled to the N local bit lines of a corresponding memory sector, and each of the at least one program block selector is coupled to the N local bit lines of a corresponding memory sector.

The method comprising the at least one program block selector applying a first voltage to a selected local bit line coupled to a selected memory block in a selected memory sector during a program mode of the selected memory block, and the at least one first pre-charge circuit pre-charging unselected local bit lines coupled to unselected memory blocks to a second voltage during the program mode of the selected memory block. N is an integer greater than 1, and the first voltage is different from the second voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
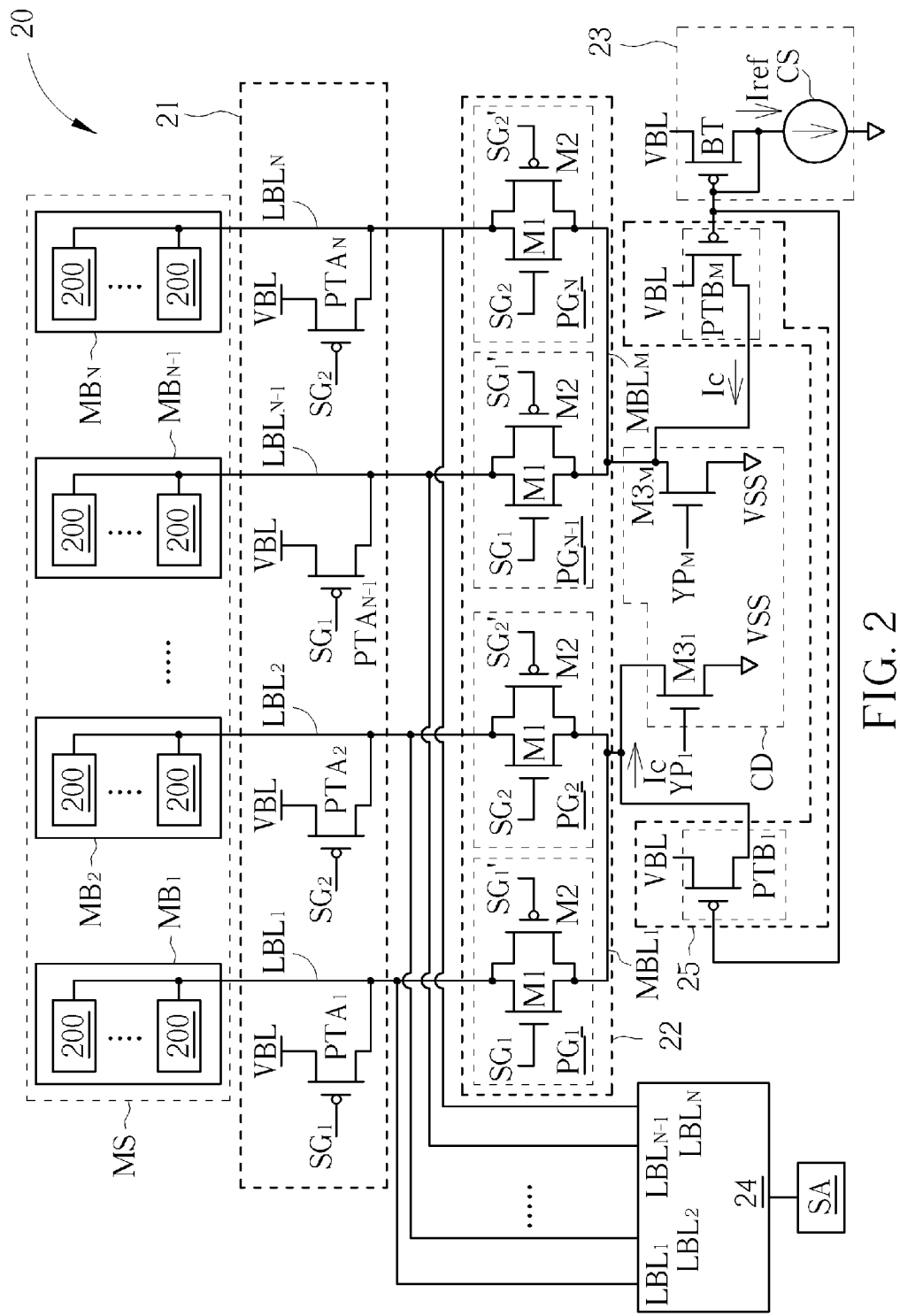
FIG. 2 shows a memory apparatus according to one embodiment of the present invention.

FIG. 2 shows a memory apparatus 20 according to one embodiment of the present invention. The memory apparatus 20 includes a memory sector MS, a first pre-charge circuit 21, and a program block selector 22. The memory sector MS includes N memory blocks $MB_1$ to $MB_N$ and N local bit lines $LBL_1$ to $LBL_N$.

Each of the memory blocks $MB_1$ to $MB_N$ includes a plurality of memory cells 200, wherein N is an integer greater than 1. Memory cells 200 in the same memory block are coupled to a same local bit line. For example, the local bit line $LBL_1$ is coupled to the memory cells 200 in the memory block $MB_1$, and the local bit line $LBL_N$ is coupled to the memory cells 200 in the memory block $MB_N$.

Figure 1:
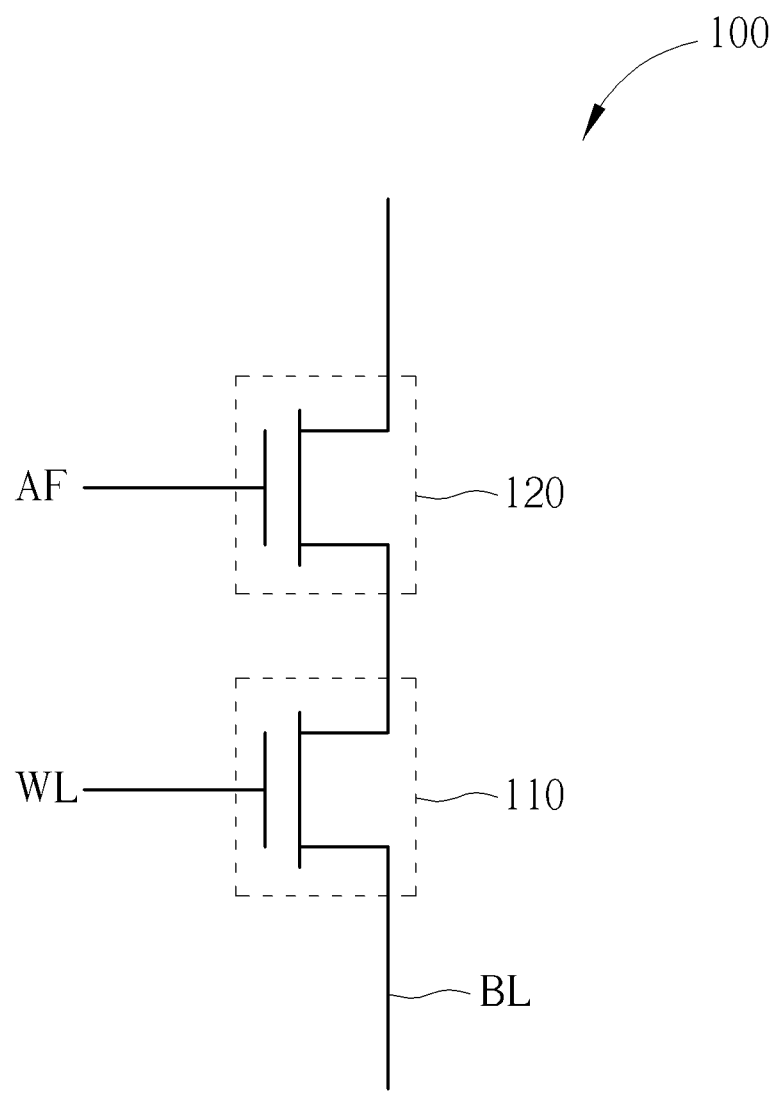
FIG. 1 shows a conventional one-time programmable memory cell.

In the present embodiment, the memory cells 200 may have the same structure as the memory cell 100 as shown in FIG. 1, and the memory cells 200 in the same memory block may be controlled by different word lines. However, the memory cell 200 is not limited to have the same structure as the memory 100. In some embodiments of the present invention, the memory cell 200 may also have a different structure from the memory cell 100. For example, the memory cell may further include a follow gate transistor coupled between the antifuse transistor 120 and the select transistor 110 to prevent breakdown of the select transistor 110 due to the high voltage when programming the memory cell.

The program block selector 22 is coupled to the N local bit lines $LBL_1$ to $LBL_N$. The program block selector 22 can provide the required voltage to a selected memory block to perform the program operations. For example, during the program operation of the selected memory block, the program block selector 22 can apply a first voltage VSS to the selected local bit line coupled to the selected memory block.

Also, to prevent the memory cells in the unselected memory blocks from leaking currents, the unselected local bit lines coupled to the unselected memory blocks are pre-charged to a second voltage VBL by the first pre-charge circuit 21 during the program mode of the selected memory block.

In FIG. 2, the program block selector 22 includes N pass gate circuits $PG_1$ to $PG_N$ and the memory apparatus further includes a column decoder CD. Each of the N pass gate circuits $PG_1$ to $PG_N$ is coupled to a local bit line of the N local bit lines $LBL_1$ to $LBL_N$ and a main bit line of M main bit lines $MBL_1$ to $MBL_M$, wherein M is a positive integer smaller than N. The column decoder CD is coupled to the M main bit lines $MBL_1$ to $MBL_M$. During the program mode of the selected memory block, one of the N pass gate circuits $PG_1$ to $PG_N$ can couple the selected local bit line to the selected main bit line, and the column decoder CD can apply the first voltage VSS to the selected main bit line.

In FIG. 2, two pass gate circuits are coupled to the same main bit line. For example, the pass gate circuit $PG_1$ is coupled to the local bit line $LBL_1$ and the main bit line $MBL_1$, the pass gate circuit $PG_2$ is coupled to the local bit line $LBL_2$ and the main bit line $MBL_1$, the pass gate circuit $PG_{N-1}$ is coupled to the local bit line $LBL_{N-1}$ and the main bit line $MBL_M$, and the pass gate circuit $PG_N$ is coupled to the local bit line $LBL_N$ and the main bit line $MBL_M$. In this example, the number of main bit lines M is half the number of local bit lines N.

Each of the pass gate circuits $PG_1$ to $PG_N$ includes a first transistor M1. The first transistor M1 has a first terminal coupled to a corresponding local bit line, a second terminal coupled to a corresponding main bit line, and a control terminal for receiving a first block selection signal. For example, the first terminal of the first transistor M1 of the pass gate circuit $PG_1$ is coupled to the local bit line $LBL_1$, while the first terminal of the first transistor M1 of the pass gate circuit $PG_N$ is coupled to the local bit line $LBL_N$. Also, the second terminal of the first transistor M1 of the pass gate circuit $PG_1$ is coupled to the main bit line $MBL_1$, while the second terminal of the first transistor M1 of the pass gate circuit $PG_N$ is coupled to the local bit line $MBL_M$.

To control the connection between the local bit lines and the main bit lines, passing gate circuits coupled to the same main bit line may receive different first block selection signals. For example, the control terminal of the first transistor M1 of the pass gate circuit $PG_1$ may receive the first block selection signal $SG_1$, while the control terminal of the first transistor M1 of the pass gate circuit $PG_2$ may receive the first block selection signal $SG_2$. In this case, if the memory block $MB_1$ is selected to perform the program operation, then the first block selection signal $SG_1$ may turn on the first transistor M1 of the pass gate circuit $PG_1$ while the first block selection signal $SG_2$ may turn off the first transistor M1 of the pass gate circuit $PG_2$. Therefore, the local bit line $LBL_1$ would be coupled to the main bit line $MBL_1$.

In FIG. 2, one main bit line is coupled to two pass gate circuits; however, in some embodiments, one main bit line may be coupled to other number of pass gate circuits according to the system requirement. For example, in some embodiments, one main bit line may be coupled to three or four pass gate circuits. In this case, the first transistors of the three or four pass gate circuits coupled to the same main bit line would receive different first block selection signals.

In addition, to reduce the signal complexity, pass gate circuits coupled to different main bit lines may receive the same first block selection signal. For example, the control terminal of the first transistor M1 of the pass gate circuit $PG_1$ may receive the first block selection signal $SG_1$, while the control terminal of the first transistor M1 of the pass gate circuit $PG_{N-1}$ may also receive the first block selection signal $SG_1$. Therefore, to apply the first voltage VSS to the selected local bit line for the program operation, the column decoder CD will further control the connection between the first voltage VSS and the main bit lines $MBL_1$ to $MBL_M$ so only the selected local bit line would receive the first voltage VSS accordingly.

The column decoder CD includes M third transistors $M3_1$ to $M3_M$. The third transistors $M3_1$ to $M3_M$ are N-type transistors. Each of the third transistors $M3_1$ to $M3_M$ has a first terminal coupled to a corresponding main bit line, a second terminal for receiving the first voltage VSS, and a control terminal for receiving a third block selection signal. For example, the first terminal of the third transistor $M3_1$ is coupled to the main bit line $MBL_1$, the second terminal of the third transistor $M3_1$ receives the first voltage VSS, and the control terminal of the third transistor $M3_1$ may receive the third block selection signal $YP_1$. Also, the first terminal of the third transistor $M3_M$ is coupled to the main bit line $MBL_M$, the second terminal of the third transistor $M3_M$ receives the first voltage VSS, and the control terminal of the third transistor $M3_M$ may receive the third block selection signal $YP_M$.

Consequently, by arranging the first block selection signals $SG_1$ and $SG_2$ and the third block selection signals $YP_1$ to $YP_M$ properly, the program block selector 22 is able to apply the first voltage VSS to the selected local bit line coupled to the selected memory block during the program mode of the selected memory block. For example, when the memory block $MB_1$ is selected, the first block selection signal $SG_1$ and the third block selection signal $YP_1$ may both be at a rather high voltage to turn on the first transistor M1 of the pass gate circuit $PG_1$ and the third transistor $M3_1$. Meanwhile, the first block selection signal $SG_2$ and the third block selection signals $YP_M$ may be at a rather low voltage to turn off the first transistors M1 of the pass gate circuits $PG_2$ to $PG_N$ and the third transistors $M3_2$ to $M3_M$. Therefore, the program block selector 22 would apply the first voltage VSS to the selected local bit line $LBL_1$, while the unselected local bit lines $LBL_2$ to $LBL_N$ would be floating.

To prevent the floating transistors from leaking currents, the first pre-charge circuit 21 can provide the bias voltage to pre-charge the local bit lines. In FIG. 2, the first pre-charge circuit 21 is coupled to the N local bit lines $LBL_1$ to $LBL_N$ and includes N first pre-charge transistors $PTA_1$ to $PTA_N$. In this embodiment, the N first pre-charge transistors $PTA_1$ to $PTA_N$ are P-type transistors. Each of the first pre-charge transistors $PTA_1$ to $PTA_N$ has a first terminal for receiving the second voltage VBL, a second terminal coupled to a corresponding local bit line, and a control terminal for receiving a corresponding first block selection signal. For example, the first terminal of the first pre-charge transistor $PTA_1$ is for receiving the second voltage VBL, the second terminal of the first pre-charge transistor $PTA_1$ is coupled to the local bit line $LBL_1$, and the control terminal of the first pre-charge transistor $PTA_1$ is for receiving the first block selection signal $SG_1$. Also, the first terminal of the first pre-charge transistor $PTA_2$ is for receiving the second voltage VBL, the second terminal of the first pre-charge transistor $PTA_2$ is coupled to the local bit line $LBL_2$, and the control terminal of the first pre-charge transistor $PTA_2$ is for receiving the first block selection signal $SG_2$.

That is, when the first block selection signal $SG_1$ turns on the first transistor M1 of the pass gate circuit $PG_1$, the first pre-charge transistor $PTA_1$ is turned off. Meanwhile, the first block selection signal $SG_2$ would turn off the first transistor M1 of the pass gate circuit $PG_2$ and turn on the first pre-charge transistor $PTA_2$. Therefore, when the selected local bit line $LBL_1$ receives the first voltage VSS, the unselected local bit line $LBL_2$ would receive the second voltage VBL. In some embodiments, the second voltage VBL can be greater than the first voltage VSS. Since the unselected local bit line $LBL_2$ is at the second voltage VBL greater than the first voltage VSS, the select transistors 110 of the memory cells 200 coupled to the unselected local bit line $LBL_2$ would not be turned on unexpectedly.

In some embodiments, the memory blocks $MB_1$ to $MB_N$ may receive system regular voltages, such as a third voltage and a fourth voltage, for performing the required operations. The third voltage may be 1.2V while the fourth voltage may be 3.3V. To program a memory cell 200, the control terminal of the antifuse transistor 120 may receive a high voltage at about 6V, and the voltage of the word line WL may be at a voltage between the third voltage and the fourth voltage, such as 2.2V, for turning on the select transistor 110 of the memory cell 200. In this case, the second voltage VBL can be substantially equal to the voltage of the word line of the selected memory cell in the selected memory block $MB_1$ during the program mode of the selected memory block $MB_1$. That is, the second voltage VBL may be 2.2V so that the unselected local bit lines $LBL_2$ to $LBL_N$ will keep the memory cells 200 in the unselected memory blocks $MB_2$ to $MB_N$ turned off.

However, those first pre-charge transistors receiving the same block selection signal $SG_1$ as the first pre-charge transistor $PTA_1$, such as the first pre-charge transistor $PTA_{N-1}$, may not be turned on during the program mode of the selected memory block $MB_1$. In this case, the leakage current may be produced on the paths of the unselected local bit lines coupled to those first pre-charge transistors. Therefore, the memory apparatus further includes a second pre-charge circuit 25, the second pre-charge circuit 25 includes M second pre-charge transistors $PTB_1$ to $PTB_M$ to further prevent current leakages on the unselected local bit lines.

In FIG. 2, the M second pre-charge transistors $PTB_1$ to $PTB_M$ are P-type transistors, and each of the second pre-charge transistors $PTB_1$ to $PTB_M$ has a first terminal for receiving the second voltage VBL, a second terminal coupled to a corresponding main bit line, and a control terminal coupled to a bias voltage for controlling a charging current $I_c$ of the second pre-charge transistor. For example, the second terminal of the second pre-charge transistor $PTB_1$ is coupled to the main bit line $MBL_1$, and the second terminal of the second pre-charge transistor $PTB_M$ is coupled to the main bit line $MBL_M$. Therefore, regardless of the block selection signals, the M second pre-charge transistors $PTB_1$ to $PTB_M$ can keep charging the main bit lines $MBL_1$ to $MBL_M$ to prevent current leakages on the paths of the unselected local bit lines. Also, to avoid the charging current $I_c$ from disturbing the program operation, the charging current $I_c$ should be smaller than the output current of the selected local bit line during the program mode of the selected memory block. In some embodiments, the charging current $I_c$ can be smaller than one percent of an output current of the selected local bit line during the program mode of the selected memory block.

In FIG. 2, the bias voltage can be provided by a bias circuit 23. The bias circuit 23 includes a current source CS and a bias transistor BT. The current source CS can generate a reference current $I_{ref}$. The bias transistor BT is a P-type transistor and has a first terminal for receiving the second voltage VBL, a second terminal coupled to the current source CS for receiving the reference current $I_{ref}$, and a control terminal coupled to the second terminal of the bias transistor BT and the M control terminals of the M second pre-charge transistors $PTB_1$ to $PTB_M$. That is, the bias transistor BT and the pre-charge transistors $PTB_1$ to $PTB_M$ can be seemed as a current mirror. Therefore, by properly selecting the dimensions of bias transistor BT and the pre-charge transistors $PTB_1$ to $PTB_M$, the intensity of the charging current $I_c$ can be controlled.

Furthermore, since the first transistors M1 are an N-type transistors so the charging current $I_c$ may have difficulty pulling up the voltage of the corresponding local bit line to the second voltage VBL through the first transistors M1 completely due to the threshold voltage of the first transistors M1. Therefore, to ensure the unselected local bit line can be pulled up to the second voltage VBL completely during the program mode of the unselected memory block, each of the pass gate circuits $PG_1$ to $PG_N$ may further includes a second transistor M2. The second transistors M2 are P-type transistors, each having a first terminal coupled to the corresponding local bit line, a second terminal coupled to the corresponding main bit line, and a control terminal configured to receive a second block selection signal complementary to the first block selection signal.

For example, the first terminal of the second transistor M2 of the pass gate circuit $PG_1$ is coupled to the local bit line $LBL_1$, the second terminal of the second transistor M2 of the pass gate circuit $PG_1$ is coupled to the main bit line $MBL_1$, and the control terminal of the second transistor M2 of the pass gate circuit $PG_1$ may receive the second block selection signal $SG_1'$ complementary to the first block selection signal $SG_1$. Similarly, the first terminal of the second transistor M2 of the pass gate circuit $PG_2$ is coupled to the local bit line $LBL_2$, the second terminal of the second transistor M2 of the pass gate circuit $PG_2$ is coupled to the main bit line $MBL_1$, and the control terminal of the second transistor M2 of the pass gate circuit $PG_2$ may receive the second block selection signal $SG_2'$ complementary to the first block selection signal $SG_2$.

Since the first transistor M1 has a positive threshold voltage and the second transistor M2 has a negative threshold voltage, the first transistor M1 and the second transistor M2 in the pass gate circuit can be operated together to pull up the voltage of the corresponding local bit line to the second voltage VBL.

Since the first pre-charge circuit 21 and the second pre-charge circuit 25 can pre-charge the unselected local bit lines during the program mode of the selected memory block, the current leakages caused by the floating transistors can be avoided. Therefore, the memory apparatus 20 can be operated with low leakage currents.

Furthermore, in some embodiments, the issue of current leakages may also occur during the read operations of memory blocks. Therefore, in FIG. 2, the memory apparatus 20 further includes a read block selector 24. The read block selector 24 can couple the selected main bit line to a sense amplifier SA during a read mode of the selected memory block. For example, if the memory block $MB_1$ is selected to be read, the read block selector 24 would couple the selected main bit line $MBL_1$ to the sense amplifier SA. The sense amplifier SA can amplify the received current for identifying the data stored in the selected memory cell.

However, in this case, since the unselected main bit lines may be floating, the unselected main bit lines can be pre-charged to the third voltage by the read block selector 24 during a read mode, and the third voltage is greater than the first voltage VSS and smaller than the second voltage VBL.

Also, since the memory apparatus 20 includes only one sector, therefore, the read block selector 24 may couple the selected local bit line, instead of the selected main bit line, to the sense amplifier SA during the read mode of the selected memory block.

In FIG. 2, since the memory apparatus 20 includes only one memory sector MS while the program block selector 22 includes the N pass gate circuits $PG_1$ to $PG_N$ and a column decoder CD for controlling the voltage of the local bit lines $LBL_1$ to $LBL_N$, the block selection signals can be simplified according to the system requirement. For example, in some embodiments of the present invention, the N first transistors M1 of the N pass gate circuits $PG_1$ to $PG_N$ may receive different block selection signals for controlling the voltage of the local bit lines $LBL_1$ to $LBL_N$ without using column decoder CD.

Figure 3:
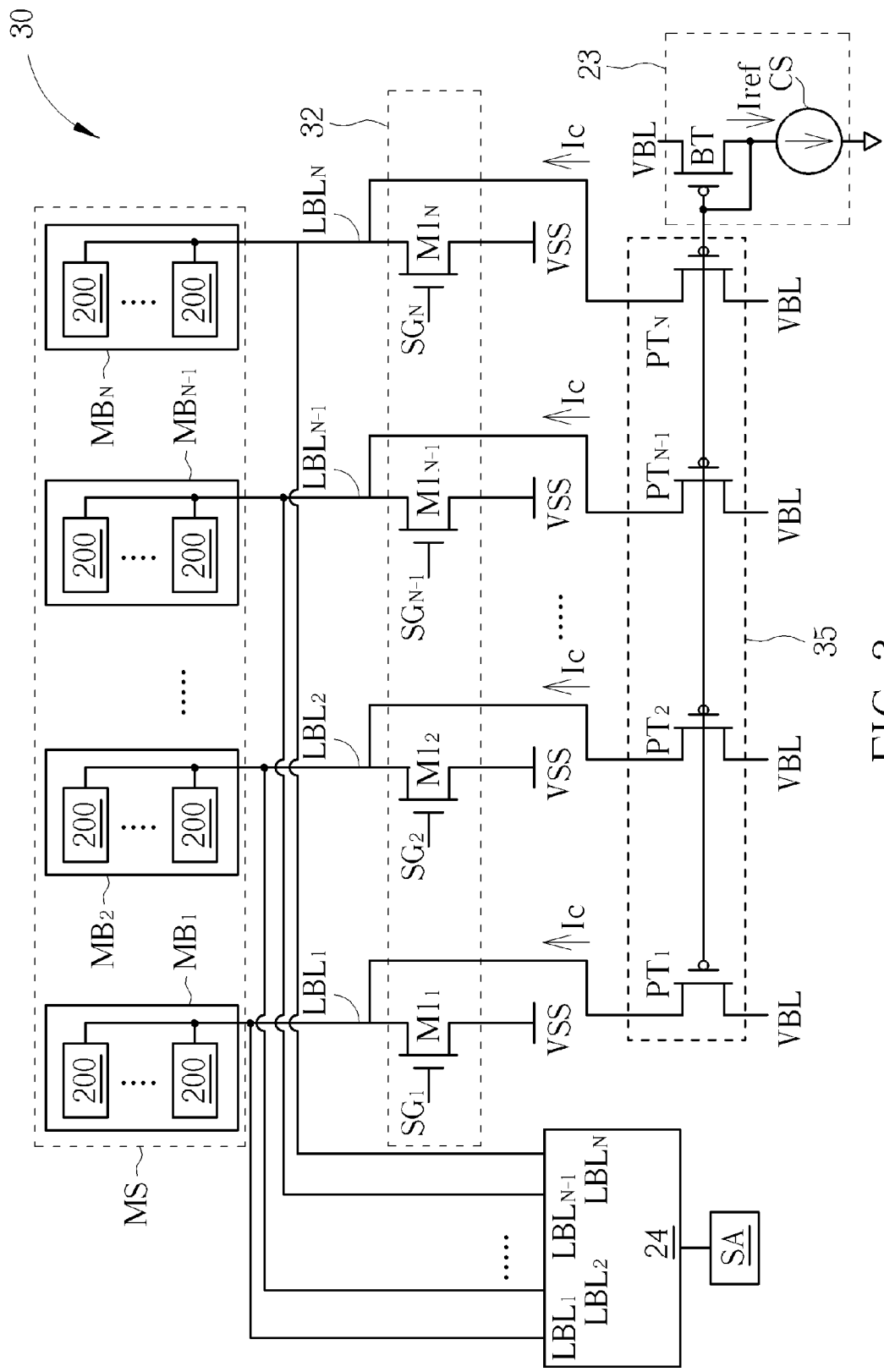
FIG. 3 shows a memory apparatus according to another embodiment of the present invention.

FIG. 3 shows a memory apparatus 30 according to one embodiment of the present invention. The memory apparatus 30 has a similar structure as the memory apparatus 20. However, in the memory apparatus 30, the N first transistors $M1_1$ to $M1_N$ of the N pass gate circuits in the program block selector 32 receive different first block selection signals $SG_1$ to $SG_N$.

For example, the first terminal of the first transistor $M1_1$ is coupled to the local bit line $LBL_1$, while the first terminal of the first transistor $M1_N$ is coupled to the local bit line $LBL_N$. Also, the control terminal of the first transistor $M1_1$ receives the first block selection signal $SG_1$, while the control terminal of the first transistor $M1_N$ receives the first block selection signal $SG_N$. Since the first block selection signals $SG_1$ to $SG_N$ are different, the program block selector 32 can apply the first voltage VSS to the selected local bit line by the first block selection signals $SG_1$ to $SG_N$.

Furthermore, the memory apparatus 30 adopts a second pre-charge circuit 35 to prevent the current leakage. The second pre-charge circuit 35 and the second pre-charge circuit 25 have the same structure and the same operation principle. However, the second pre-charge 35 are coupled to the local bit lines $LBL_1$ to $LBL_N$. Thus, the second pre-charge circuit 35 includes N second pre-charge transistors $PT_1$ to $PT_N$ to prevent current leakages on the unselected local bit lines.

Consequently, the second pre-charge circuit 35 of the memory apparatus 30 can pre-charge the local bit lines $LBL_1$ to $LBL_N$ during the program mode of the selected memory block, thereby preventing the memory cells in the unselected memory blocks from leaking currents.

However, in some embodiments of the preset invention, the memory apparatus 30 may adopt the first pre-charge circuit 21 instead of the second pre-charge circuit 35. In this case, each of the local bit lines $LBL_1$ to $LBL_N$ can still be pre-charged to the second voltage VBL if not selected. That is, the designer can choose to adopt the first pre-charge circuit 21, the second pre-charge circuit 35, or even both of them to prevent the current leakages according to the system requirement.

Figure 4A:
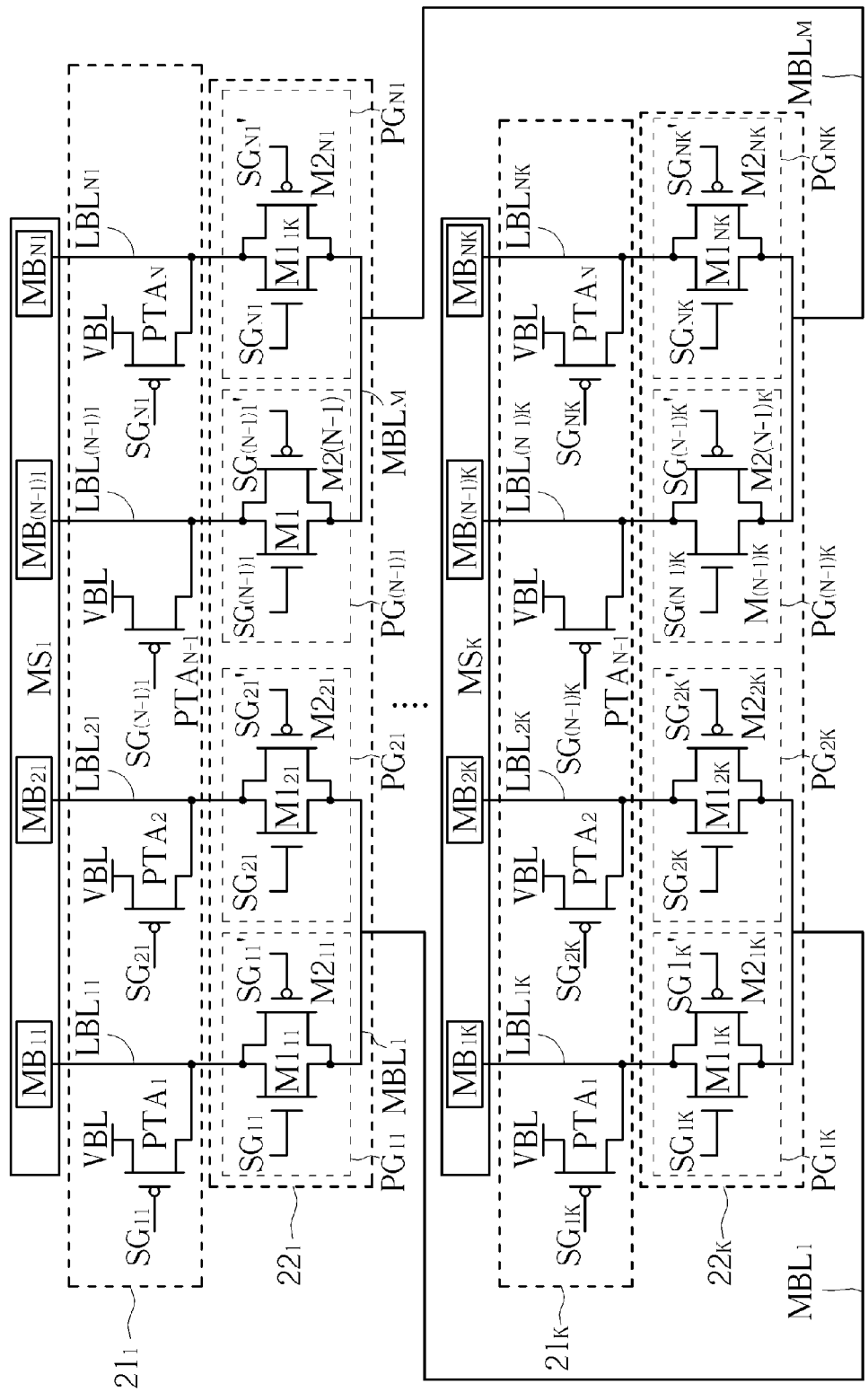
FIGS. 4A and 4B show a memory apparatus according to another embodiment of the present invention.
Figure 4B:
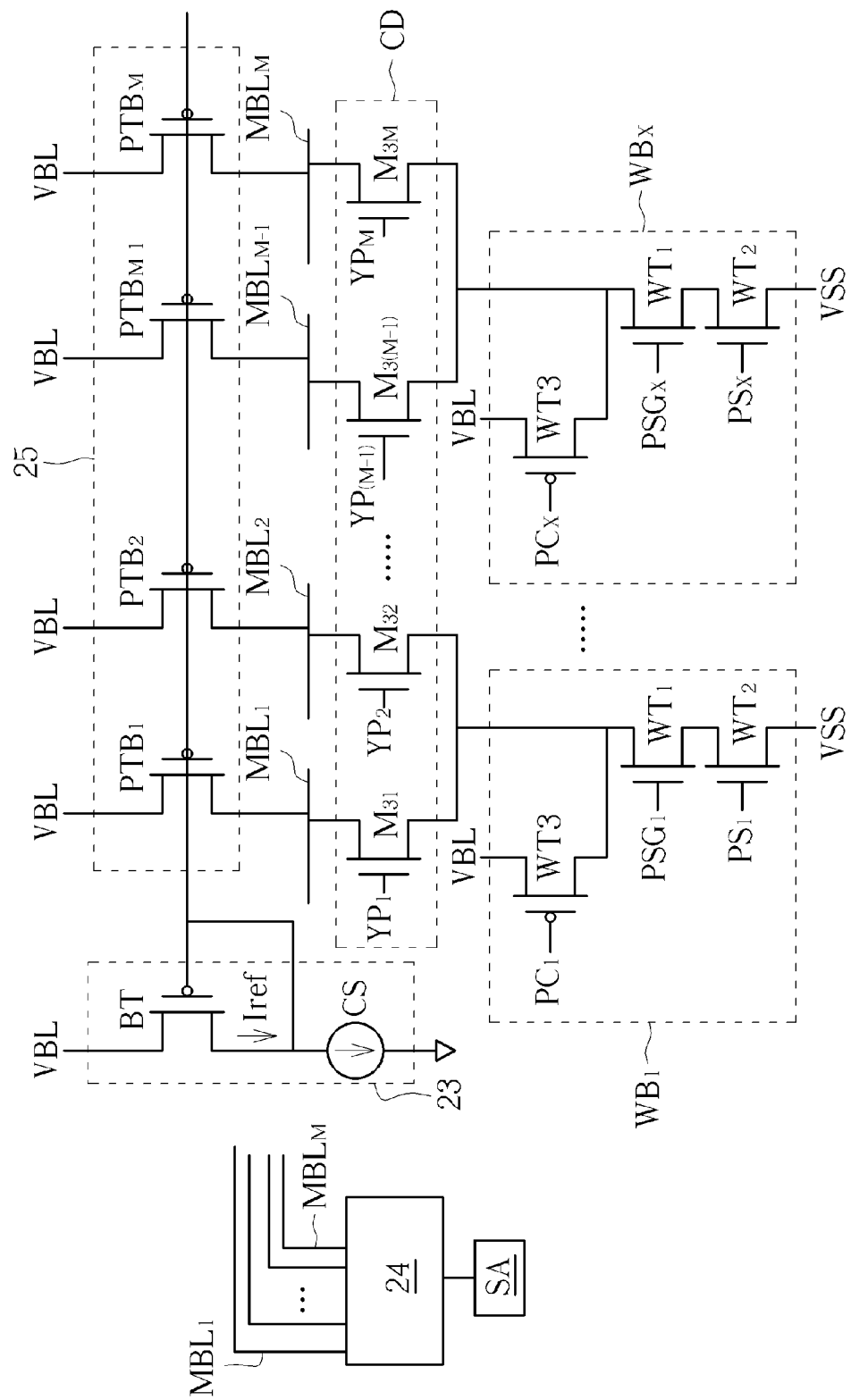

FIGS. 4A and 4B show a memory apparatus 40 according to another embodiment of the present invention. In FIG. 4A, the memory apparatus 40 includes K memory sectors $MS_1$ to $MS_K$, K first pre-charge circuits $21_1$ to $21_K$, K program block selectors $22_1$ to $22_K$ and M main bit lines $MBL_1$ to $MBL_M$. K is an integer greater than 1. Each of the memory sectors $MS_1$ to $MS_K$ has the same structure as the memory sector MS as shown in FIG. 2. The memory sectors $MS_1$ includes N memory blocks $MB_{11}$ to $MB_{N1}$, each coupled to a corresponding local bit line of the N local bit lines $LBL_{11}$ to $LBL_{N1}$. The memory sectors $MS_K$ includes N memory blocks $MB_{1K}$ to $MB_{NK}$, each coupled to a corresponding local bit line of the N local bit lines $LBL_{1K}$ to $LBL_{NK}$. The K program block selectors $22_1$ to $22_K$ are coupled to the M main bit lines $MBL_1$ to $MBL_M$. Moreover, the M main bit lines $MBL_1$ to $MBL_M$ are coupled to the column decoder CD as shown in FIG. 4B. And the column decoder CD is couple to the second pre-charge circuit 25 which is coupled to the bias circuit 23 and X write buffers $WB_1$ to $WB_X$. In some embodiments, the second pre-charge circuit 25 in FIG. 4B can be replaced by pre-charge circuits similar with a first pre-charge circuit with $PTA_1$ to $PTA_M$, wherein the control terminals of pre-charge circuits are connected to a corresponding third block selection signal $YP_1$ to $YP_M$ in the column decoder CD directly.

Each of the K program block selectors $22_1$ to $22_K$ has the same structure as the program block selector 22 as shown in FIG. 2, and each of the K first pre-charge circuits $21_1$ to $21_K$ has the same structure as the first pre-charge circuit 21 as shown in FIG. 2. However, the first transistors in the pass gate circuits of the K program block selectors $22_1$ to $22_K$ receive different first block selection signals. For example, the first transistors $M1_{11}$ to $M1_{N1}$ in the pass gate circuits $PG_{11}$ to $PG_{N1}$ of the program block selector $22_1$ receive the first block selection signals $SG_{11}$ to $SG_{N1}$ respectively while the first transistors $M1_{1K}$ to $M1_{NK}$ in the pass gate circuits $PG_{1K}$ to $PG_{NK}$ of the program block selector $22_K$ receive the first block selection signals $SG_{1K}$ to $SG_{NK}$ respectively. Therefore, the first pre-charge transistors $PTA_1$ to $PTA_N$ in the K first pre-charge circuits $21_1$ to $21_K$ would also receive different first block selection signals accordingly. Similarly, the second transistors in the pass gate circuits of the K program block selectors $22_1$ to $22_K$ receive different second block selection signals. For example, the second transistors $M2_{11}$ to $M2_{N1}$ in the pass gate circuits $PG_{11}$ to $PG_{N1}$ of the program block selector $22_1$ receive the second block selection signals $SG_{11}'$ to $SG_{N1}'$ respectively, and the second transistors $M2_{1K}$ to $M2_{NK}$ in the pass gate circuits $PG_{1K}$ to $PG_{NK}$ of the program block selector $22_K$ receive the second block selection signals $SG_{1K}'$ to $SG_{NK}'$ respectively.

Therefore, by controlling the first block selection signals $SG_{11}$ to $SG_{NK}$, only the selected local bit line coupled to the selected memory block in the selected memory sector would be coupled to the corresponding main bit line for receiving the first voltage during the program mode of the selected memory block. For example, if the memory block $MB_{11}$ in the memory sector $MS_1$ is selected, the first block selection signals $SG_{11}$ may be at a rather high voltage to turn on the first transistor $M1_{11}$ so the selected local bit line $LBL_{11}$ would be coupled to the selected main bit line $MBL_1$. In this case, the column decoder CD would also turn on the third transistor $M3_1$. However, instead of receiving the first voltage VSS directly, the column decoder CD is receiving the first voltage VSS through X write buffers $WB_1$ to $WB_X$ in FIG. 4B.

Each of the X write buffers $WB_1$ to $WB_X$ includes a port select transistor WT1, a program transistor WT2, and a buffer pre-charge transistor WT3. The port select transistor WT1 has a first terminal coupled to Y second terminals of Y corresponding third transistors of the M third transistors $M3_1$ to $M3_M$, a second terminal, and a control terminal for receiving a port select signal. X is a positive integer, Y is a positive integer greater than 1, and a product of X and Y equals to M. In the present embodiment of FIGS. 4A and 4B, Y equals to 2, X equals to M/2. The program transistor WT2 has a first terminal coupled to the second terminal of the port select transistor WT1, a second terminal for receiving the first voltage VSS, and a control terminal for receiving a program signal. The buffer pre-charge transistor WT3 has a first terminal for receiving the second voltage VBL, a second terminal coupled to the first terminal of the port select transistor WT1, and a control terminal for receiving a buffer pre-charge signal.

The X control terminals of the X port select transistors WT1 in the write buffers $WB_1$ to $WB_X$ may receive different port select signals $PSG_1$ to $PSG_X$, the X control terminals of the X program transistors WT2 in the write buffers $WB_1$ to $WB_X$ may receive different program signals $PS_1$ to $PS_X$, and the X control terminals of the X buffer pre-charge transistor WT3 in the write buffers $WB_1$ to $WB_X$ may receive different buffer pre-charge signals $PC_1$ to $PC_K$. Therefore, the X write buffers $WB_1$ to $WB_X$ can be controlled independently.

In some embodiments, when the port select signal $PSG_1$ turns on the port select transistor WT1 in the write buffers $WB_1$ and the program signal $PS_1$ turns on the program transistor WT2 in the write buffers $WB_1$, the buffer pre-charge signal $PC_1$ would turn off the buffer pre-charge transistor WT3 in the write buffers $WB_1$. In this case, the main bit line $MBL_1$ coupled to the write buffers $WB_1$ would receive the first voltage VSS. In contrary, when the port select signal $PSG_1$ turns off the port select transistor WT1 in the write buffers $WB_1$ and the program signal $PS_1$ turns off the program transistor WT2 in the write buffers $WB_1$, the buffer pre-charge signal $PC_1$ may turn on the buffer pre-charge transistor WT3 in the write buffers $WB_1$. In this case, the main bit line $MBL_1$ would be pre-charged to the second voltage VBL by the buffer pre-charge transistor WT3 in the write buffers $WB_1$, thereby preventing the current leakage. In some embodiments, the port select signals $PSG_1$ to $PSG_X$ may be used to choose the selected path, and the program signals $PS_1$ to $PS_X$ may be used to indicate the program status. Therefore, the write buffers $WB_1$ to $WB_X$ can be used to support multiple input/output ports systems, and may also be applied to the memory apparatus 20 and 30 according to the system requirement.

Since each of the memory sectors $MS_1$ to $MS_K$ can be pre-charged by the first pre-charge circuit $21_1$ to $21_K$ when not selected, and each of the main bit lines $MBL_1$ to $MBL_M$ can be pre-charged by the second pre-charge circuit 25, the current leakages caused by the floating transistors can be avoided. Therefore, the memory apparatus 40 can support the operations of a plurality of memory sectors while being operated with low leakage currents.

Figure 5:
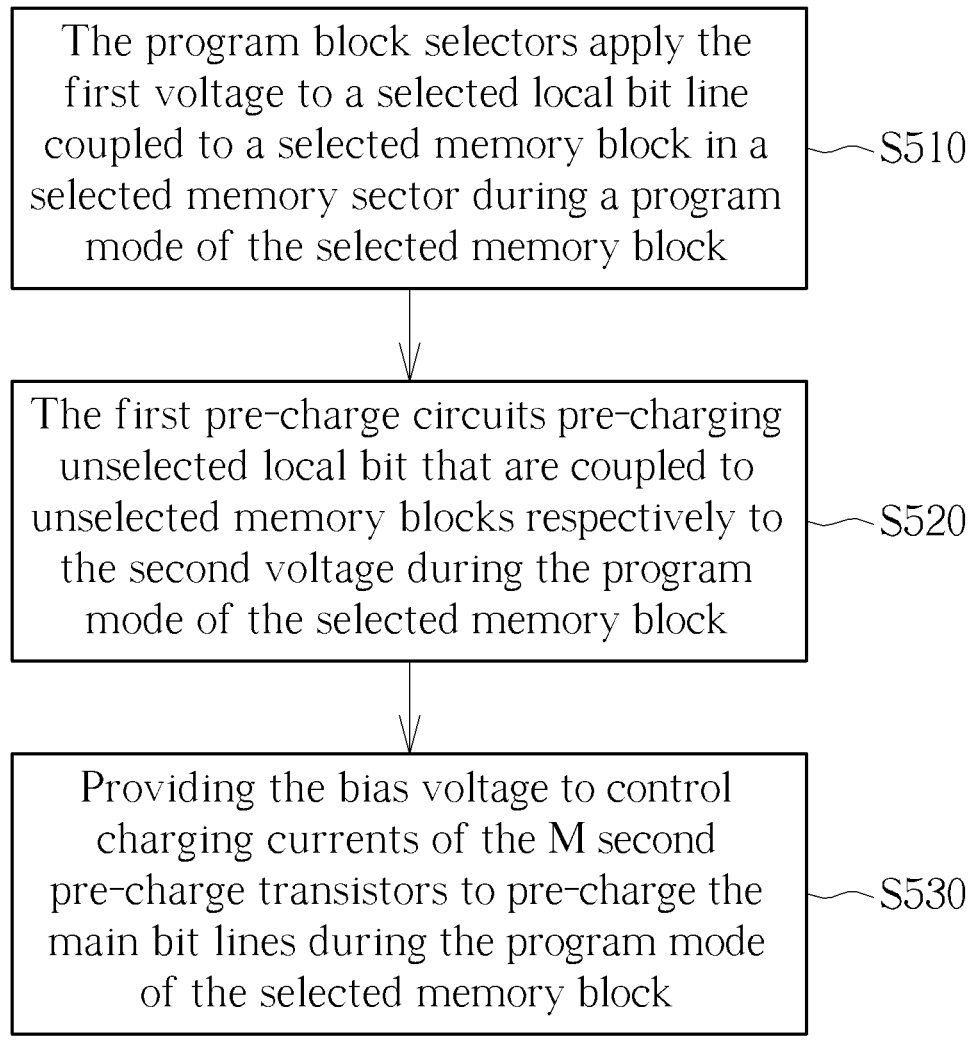
FIG. 5 shows a method for operating the memory apparatuses in FIGS. 4A and 4B according to one embodiment of the present invention.

FIG. 5 shows a method 500 for operating the memory apparatuses 40 according to one embodiment of the present invention. The method 500 includes steps S510 to S540, but is not limited to the order shown in FIG. 5.

S510: the program block selectors $22_1$ to $22_K$ apply the first voltage VSS to a selected local bit line $LBL_{11}$ coupled to a selected memory block $MB_{11}$ in a selected memory sector $MS_1$ during a program mode of the selected memory block $MB_{11}$;

S520: the first pre-charge circuits $21_1$ to $21_K$ pre-charging unselected local bit lines $LBL_{21}$ to $LBL_{NK}$ that are coupled to unselected memory blocks $MB_{21}$ to $MB_{NK}$ respectively to the second voltage VBL during the program mode of the selected memory block $MB_{11}$; and S530: providing the bias voltage to control charging currents $I_c$ of the M second pre-charge transistors $PTB_1$ to $PTB_M$ to pre-charge the main bit lines $MBL_1$ to $MBL_M$ during the program mode of the selected memory block $MB_{11}$.

According to method 500, during the program mode of the selected memory block $MB_{11}$, the selected local bit line $LBL_{11}$ would receive the first voltage through the program block selector $22_1$ for the program operation in step S510. In some embodiments, this can be done by the program block selector $22_1$ to couple the selected local bit line $LBL_{11}$ to the selected main bit line $MBL_1$ during the program mode of the selected memory block $MB_{11}$ and the column decoder CD to apply the first voltage VSS to the selected main bit line $MBL_1$ during the program mode of the selected memory block $MB_{11}$.

Also, in step S520, the unselected local bit lines $LBL_{21}$ to $LBL_{NK}$ would be pre-charged to the second voltage VBL by the first pre-charge circuits $21_1$ to $21_K$. In some embodiments, this can be done by controlling first block selection signals $SG_{21}$ to $SG_{NK}$ received by first transistors $M1_{21}$ to $M1_{NK}$ that are coupled to the unselected local bit lines $LBL_{21}$ to $LBL_{NK}$ to turn off the first transistors $M1_{21}$ to $M1_{NK}$ coupled to the unselected local bit lines $LBL_{21}$ to $LBL_{NK}$ and turn on first pre-charge transistors coupled to the unselected local bit lines $LBL_{21}$ to $LBL_{NK}$ during the program mode of the selected memory block $MB_{11}$.

In addition to step S520, in step S530, the main bit lines $MBL_1$ to $MBL_M$ can be pre-charged by the second pre-charge circuit 25. Consequently, the method 500 can prevent the current leakages caused by the floating transistors. Also, the method 500 may also be applied to the memory apparatus 20 or 30 with proper operations.

In summary, according to the memory apparatuses provided by the embodiments of the present invention, the memory apparatuses can pre-charge the local bit line during the program operations. Therefore, the leakage currents produced by the memory cells in the unselected memory blocks can be avoided, and the memory apparatuses of the present invention are able to operate with low power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory apparatus comprising:
    at least one memory sector, each comprising:
        N memory blocks, each comprising a plurality of memory cells, wherein N is an integer greater than 1; and
        N local bit lines, each coupled to memory cells in a corresponding memory block;
    at least one first pre-charge circuit, each coupled to N local bit lines of a corresponding memory sector; and
    at least one program block selector, each coupled to N local bit lines of a corresponding memory sector and configured to apply a first voltage to a selected local bit line coupled to a selected memory block of a selected memory sector during a program mode of the selected memory block;
    wherein:
    unselected local bit lines coupled to unselected memory blocks are pre-charged to a second voltage by the at least one first pre-charge circuit during the program mode of the selected memory block; and
    the first voltage is different from the second voltage.

2. The memory apparatus of claim 1, wherein the second voltage is substantially equal to a voltage of a word line of a selected memory cell in the selected memory block of the selected memory sector during the program mode of the selected memory block.

3. The memory apparatus of claim 1, wherein:
    the memory apparatus comprises M main bit lines, wherein M is a positive integer smaller than N;
    each of the at least one program block selector comprises N pass gate circuits, each coupled to a local bit line and a main bit line of the M main bit lines and configured to couple the selected local bit line to a selected main bit line during the program mode of the selected memory block; and
    the memory apparatus further comprises a column decoder coupled to the M main bit lines and configured to apply the first voltage to the selected main bit line during the program mode of the selected memory block.

4. The memory apparatus of claim 3, wherein:
    each of the N pass gate circuits comprises a first transistor having a first terminal coupled to a corresponding local bit line, a second terminal coupled to a corresponding main bit line, and a control terminal configured to receive a first block selection signal; and
    the first transistor is an N-type transistor.

5. The memory apparatus of claim 4, wherein each of the at least one first pre-charge circuit comprises N first pre-charge transistors, each having a first terminal configured to receive the second voltage, a second terminal coupled to a corresponding local bit line, and a control terminal configured to receive a corresponding first block selection signal, the N first pre-charge transistors are P-type transistors.

6. The memory apparatus of claim 4, further comprising a second pre-charge circuit, the second pre-charge circuit comprising M second pre-charge transistors, each having a first terminal configured to receive the second voltage, a second terminal coupled to a corresponding main bit line, and a control terminal coupled to a bias voltage for controlling a charging current of the second pre-charge transistor, the M second pre-charge transistors are P-type transistors.

7. The memory apparatus of claim 6, wherein the charging current is smaller than one percent of an output current of the selected local bit line during the program mode of the selected memory block.

8. The memory apparatus of claim 6, wherein the bias voltage is provided by a bias circuit comprising:
    a current source generating a reference current; and
    a bias transistor having a first terminal configured to receive the second voltage, a second terminal coupled to the current source for receiving the reference current, and a control terminal coupled to the second terminal of the bias transistor and M control terminals of the M second pre-charge transistors, the bias transistor is a P-type transistor.

9. The memory apparatus of claim 6, wherein:
    each of the N pass gate circuits further comprises a second transistor having a first terminal coupled to the corresponding local bit line, a second terminal coupled to the corresponding main bit line, and a control terminal configured to receive a second block selection signal complementary to the first block selection signal; and
    the second transistor is a P-type transistor.

10. The memory apparatus of claim 3, wherein the column decoder comprises M third transistors, each having a first terminal coupled to a corresponding main bit line, a second terminal configured to receive the first voltage, and a control terminal configured to receive a third block selection signal.

11. The memory apparatus of claim 10, further comprising a second pre-charge circuit, the second pre-charge circuit comprising M second pre-charge transistors, each having a first terminal configured to receive the second voltage, a second terminal coupled to the corresponding main bit line, and a control terminal configured to receive a corresponding third block selection signal, the M second pre-charge transistors are P-type transistors.

12. The memory apparatus of claim 3, wherein:
    the column decoder comprises M third transistors, each having a first terminal coupled to a corresponding main bit line, a second terminal, and a control terminal configured to receive a third block selection signal; and
    the memory apparatus further comprises X write buffers, each comprising:
        a port select transistor having a first terminal coupled to Y second terminals of Y corresponding third transistors of the M third transistors, a second terminal, and a control terminal configured to receive a port select signal, wherein X is a positive integer, Y is a positive integer greater than 1, and a product of X and Y equals to M;
        a program transistor having a first terminal coupled to the second terminal of the port select transistor, a second terminal configured to receive the first voltage, and a control terminal configured to receive a program signal; and
        a buffer pre-charge transistor having a first terminal configured to receive the second voltage, a second terminal coupled to the first terminal of the port select transistor, and a control terminal configured to receive a buffer pre-charge signal;
    when the port select signal turns on the port select transistor and the program signal turns on the program transistor, the buffer pre-charge signal turns off the buffer pre-charge transistor.

13. The memory apparatus of claim 3 further comprising a read block selector configured to couple the selected main bit line to a sense amplifier during a read mode of the selected memory block, wherein unselected main bit lines are pre-charged to a third voltage, and the third voltage is greater than the first voltage and smaller than the second voltage.

14. The memory apparatus of claim 1, wherein:
a number of the at least one first pre-charge circuit, a number of the at least one program block selector circuit, and a number of the at least one memory sector are the same.

15. The memory apparatus of claim 1, wherein:
the at least one program block selector comprises N pass gate circuits, each comprising a first transistor having a first terminal coupled to a corresponding local bit line, a second terminal, and a control terminal configured to receive a first block selection signal;
N control terminals of N first transistors of the N pass gate circuits receive different first block selection signals; and
the N first transistors are a N-type transistors.

16. The memory apparatus of claim 15, wherein each of the at least one first pre-charge circuit comprises N first pre-charge transistors, each having a first terminal configured to receive the second voltage, a second terminal coupled to a corresponding local bit line, and a control terminal configured to receive a corresponding first block selection signal, the N first pre-charge transistors are P-type transistors.

17. The memory apparatus of claim 15, further comprising a second pre-charge circuit, the second pre-charge circuit comprising N second pre-charge transistors, each having a first terminal configured to receive the second voltage, a second terminal coupled to a corresponding local bit line, and a control terminal coupled to a bias voltage for controlling a charging current of the pre-charge transistor.

18. The memory apparatus of claim 17, wherein the charging current is no greater than one percent of an output current of the selected local bit line during the program mode of the selected memory block.

19. The memory apparatus of claim 17, wherein:
each of the N pass gate circuits further comprises a second transistors, each having a first terminal coupled to the corresponding local bit line, a second terminal coupled to the corresponding main bit line, and a control terminal configured to receive a second block selection signal complementary to the first block selection signal; and
the second transistor is P-type transistor.

20. The memory apparatus of claim 15, further comprising X write buffers, each comprising:
a port select transistor having a first terminal coupled to Y second terminals of Y corresponding first transistors of the N first transistors, a second terminal, and a control terminal configured to receive a port select signal, wherein X is a positive integer, Y is a positive integer greater than 1, and a product of X and Y equals to N;
a program transistor having a first terminal coupled to the second terminal of the port select transistor, a second terminal configured to receive the first voltage, and a control terminal configured to receive a program signal; and
a buffer pre-charge transistor having a first terminal configured to receive the second voltage, a second terminal coupled to the first terminal of the port select transistor, and a control terminal configured to receive a buffer pre-charge signal;

wherein, when the port select signal turns on the port select transistor and the program signal turns on the program transistor, the buffer pre-charge signal turns off the buffer pre-charge transistor.

21. The memory apparatus of claim 15 further comprising a read block selector configured to couple the selected main bit line to a sense amplifier during a read mode of the selected memory block, wherein the unselected local bit lines are pre-charged to a third voltage, and the third voltage is greater than the first voltage and smaller than the second voltage.

22. A method for operating a memory apparatus, the memory apparatus comprising at least one memory sector, at least one first pre-charge circuit, and at least one program block selector, each of the at least one memory sector comprising N memory blocks and N local bit lines, each of the N memory blocks comprising a plurality of memory cells, each of the N local bit lines being coupled to memory cells in a corresponding memory block, each of the at least one first pre-charge circuit being coupled to the N local bit lines of a corresponding memory sector, each of the at least one program block selector being coupled to the N local bit lines of a corresponding memory sector, and the method comprising:
the at least one program block selector applying a first voltage to a selected local bit line coupled to a selected memory block in a selected memory sector during a program mode of the selected memory block; and
the at least one first pre-charge circuit pre-charging unselected local bit lines coupled to unselected memory blocks to a second voltage during the program mode of the selected memory block;
wherein:
the first voltage is different from the second voltage; and
N is an integer greater than 1.

23. The method of claim 22, wherein the second voltage is substantially equal to a voltage of a word line of a selected memory cell in the selected memory block during the program mode of the selected memory block.

24. The method of claim 22, wherein:
the memory apparatus comprises M main bit lines and a column decoder coupled to the M main bit lines, wherein M is a positive integer smaller than N;
the at least one program block selector is further coupled to a main bit line of the M main bit lines; and
the at least one program block selector applying the first voltage to the selected local bit line coupled to the selected memory block in the selected memory sector during the program mode of the selected memory block comprises:
the at least one program block selector coupling the selected local bit line to a selected main bit line during the program mode of the selected memory block; and
the column decoder applying the first voltage to the selected main bit line during the program mode of the selected memory block.

25. The method of claim 24, wherein:
each of the at least one program block selector comprises N first transistors, each having a first terminal coupled to a corresponding local bit line, a second terminal coupled to a corresponding main bit line, and a control terminal configured to receive a first block selection signal;
each of the first pre-charge circuit comprises N first pre-charge transistors, each having a first terminal configured to receive the second voltage, a second terminal coupled to a corresponding local bit line, and a control terminal configured to receive a corresponding first block selection signal;

the N first transistors are N-type transistors and the N first pre-charge transistors are P-type transistors;

the at least one program block coupling the selected local bit line to the selected main bit line during the program mode of the selected memory block is controlling a first block selection signal received by a first transistor coupled to the selected local bit line to turn on the first transistor coupled to the selected local bit line and turn off a first pre-charge transistor coupled to the selected local bit line; and the at least one pre-charge circuit pre-charging the unselected local bit lines coupled to the unselected memory blocks to the second voltage during the program mode of the selected memory block is controlling first block selection signals received by first transistors coupled to the unselected local bit lines to turn off the first transistors coupled to the unselected local bit lines and turn on first pre-charge transistors coupled to the unselected local bit lines during the program mode of the selected memory block.

26. The method of claim 25, wherein:

the memory apparatus further comprises a second pre-charge circuit comprising M second pre-charge transistors, each having a first terminal configured to receive the second voltage, a second terminal coupled to a corresponding main bit line, and a control terminal coupled to a bias voltage; and the method further comprises providing the bias voltage to control charging currents of the M second pre-charge transistors to pre-charge unselected main bit lines during the program mode of the selected memory block.

27. The method of claim 22, wherein:

the memory apparatus further comprises a read block selector; and the method further comprises:
  the read block selector coupling the selected main bit line to a sense amplifier during a read mode of the selected memory block; and
  pre-charging unselected main bit lines to a third voltage, and the third voltage is greater than the first voltage and smaller than the second voltage.

* * * * *